US007438448B2

(12) United States Patent
Chen

(10) Patent No.: US 7,438,448 B2
(45) Date of Patent: Oct. 21, 2008

(54) LIGHT SET WITH HEAT DISSIPATION MEANS

(75) Inventor: Jeffrey Chen, Hsinchu (TW)

(73) Assignee: Neobulb Technologies, Inc., Bandar Seri Begawan (BN)

(*) Notice: Subject to any disclaimer, the term of this patent is extended or adjusted under 35 U.S.C. 154(b) by 54 days.

(21) Appl. No.: 11/019,161

(22) Filed: Dec. 23, 2004

(65) Prior Publication Data

US 2006/0098439 A1 May 11, 2006

(30) Foreign Application Priority Data

Nov. 10, 2004 (TW) ............................ 93130725 A

(51) Int. Cl.
*B60Q 1/06* (2006.01)
*H01L 23/10* (2006.01)

(52) U.S. Cl. ...................... 362/373; 362/294; 362/295; 362/800; 257/706

(58) Field of Classification Search ................ 362/547, 362/548, 194, 195, 294, 295, 373, 800, 545, 362/218, 345; 257/706
See application file for complete search history.

(56) References Cited

U.S. PATENT DOCUMENTS

| | | | | |
|---|---|---|---|---|
| 6,465,961 | B1 * | 10/2002 | Cao | 362/235 |
| 6,897,486 | B2 * | 5/2005 | Loh | 257/81 |
| 6,910,794 | B2 | 6/2005 | Rice | |
| 7,083,305 | B2 | 8/2006 | Galli | |
| 2005/0231983 | A1 * | 10/2005 | Dahm | 362/800 |
| 2005/0279949 | A1 * | 12/2005 | Oldham et al. | 250/458.1 |

FOREIGN PATENT DOCUMENTS

WO WO2004/100220 A2 11/2004

* cited by examiner

*Primary Examiner*—Ali Alavi
*Assistant Examiner*—William J Carter
(74) *Attorney, Agent, or Firm*—Rosenberg, Klein & Lee

(57) ABSTRACT

Disclosed is a light source, which includes a light-permeable casing, a thermoconductor, which is mounted inside the casing and has a flat end portion, a plurality of radiation fins fastened to the periphery of the thermoconductor inside the casing, a light source formed of an array of LEDs and installed in the flat end portion of the thermoconductor inside the casing, and a power unit mounted inside the casing to provide the light source with the necessary working voltage.

24 Claims, 13 Drawing Sheets

LIGHT SET WITH HEAT DISSIPATION MEANS

BACKGROUND OF THE INVENTION

1. Field of the Invention

The present invention relates to a light set and more particularly, to a light set with heat dissipation means that has a heat dissipation module mounted inside the casing to dissipate heat during the operation of the light source thereof.

2. Description of the Related Art

Since the invention of incandescent lamp by Thomas Alva Edison (1847-1931), electric lighting has greatly improved our living style. Nowadays, a variety of lighting fixtures have been developed for different applications, for example, home and office illumination or for use in motor vehicles.

FIG. 1 illustrates a conventional LED type light set. The light set comprises a solid metal plate, for example, aluminum plate 10, a LED (light emitting diode) or LEDs 12 mounted on the aluminum plate 10, and a circuit 14 provided around the border area of the aluminum plate 10 for controlling the operation of the LED(s) 12. The aluminum plate 10 is adapted to dissipate heat from the LED(s) 12. However, the low heat dissipation working efficiency of the aluminum plate 10 is insufficient to carry heat away from the LED(s) 12.

Vapor Chambers are commonly used in cooling modules for electronic apparatus. FIG. 2 shows a pipe shape Vapor Chamber according to the prior art. According to this design, the Vapor Chamber 2 comprises a hollow body 20 that is kept in a vacuum status, a capillary structure 22 formed inside the hollow body 20, and a working fluid (not shown) filled in the hollow body 20. When in use, one side, namely, the hot side of the hollow body 20 of the Vapor Chamber 2 is maintained closely attached to the heat source (power-consuming chip, CPU, or LCD) 26. During operation of the heat source 26, the working fluid in the hollow body 20 is heated into steam by heat energy from the heat source 26. Produced steam passes (transport) from the hot side of the hollow body 20 to the other side, namely, the cold side where steam is condensed into fluid, which is then guided back to the hot side of the hollow body 20 by the capillary structure 22. By means of interchange between fluid state and steam state, the thermal could be quickly carried away from the heat source.

It is practical to use the aforesaid thermoconductor with a light source to carry heat from the light source during its operation, so that the working efficiency of the light source can be greatly improved.

SUMMARY OF THE INVENTION

The present invention has been accomplished under the circumstances in view. It is one object of the present invention to provide a light set, which is equipped with radiation fins to dissipate heat efficient during the operation of the light source thereof, so as to improve the working efficiency of the light source and prolongs its service life. It is another object of the present invention to provide a light set, which has air vents formed in the casing thereof for quick dissipation of heat during the operation of the light source thereof.

To achieve these and other objects of the present invention, the light set comprises a casing that admits light; a thermoconductor mounted inside the casing, the thermoconductor having a flat end portion; at least one radiation fin fastened to the periphery of the thermoconductor inside the casing; a light source installed in the flat end portion of the thermoconductor; and a power unit mounted inside the casing and electrically connected to the light source to provide the light source with the necessary working voltage.

DETAILED DESCRIPTION OF THE PREFERRED EMBODIMENT

Figure 1:
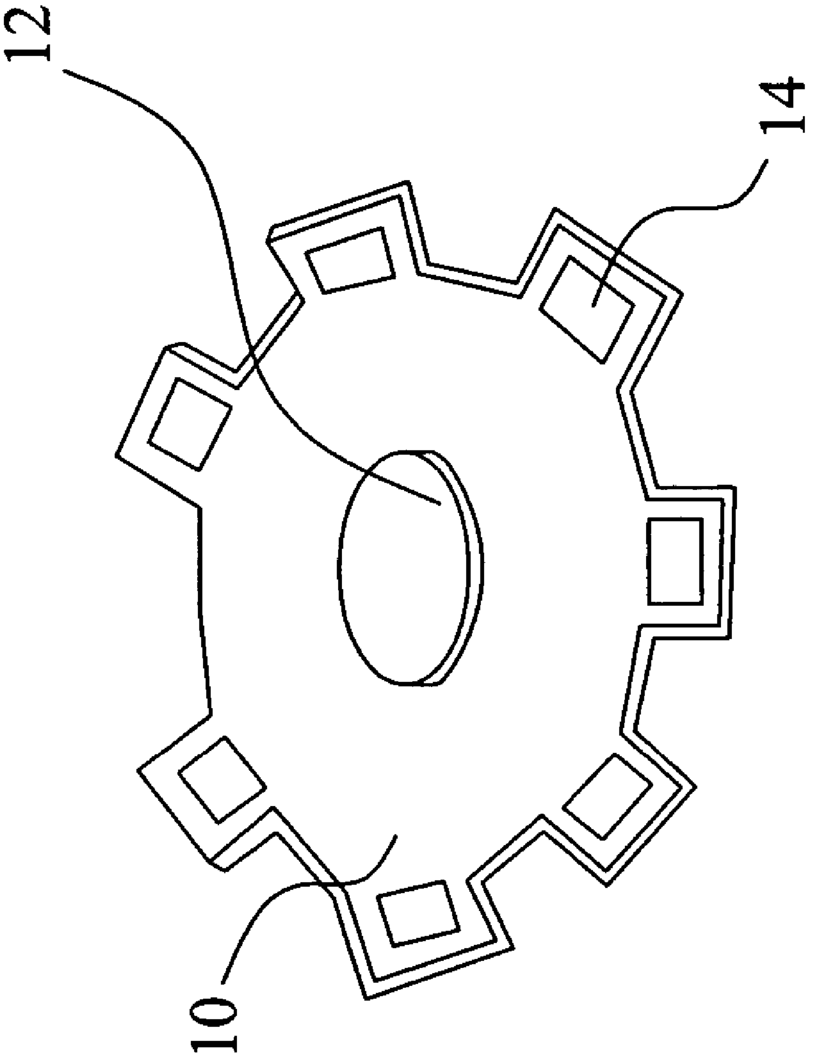
FIG. 1 (PRIOR ART)
FIG. 1 is an elevational view of a LED type light set according to the prior art.
Figure 2:
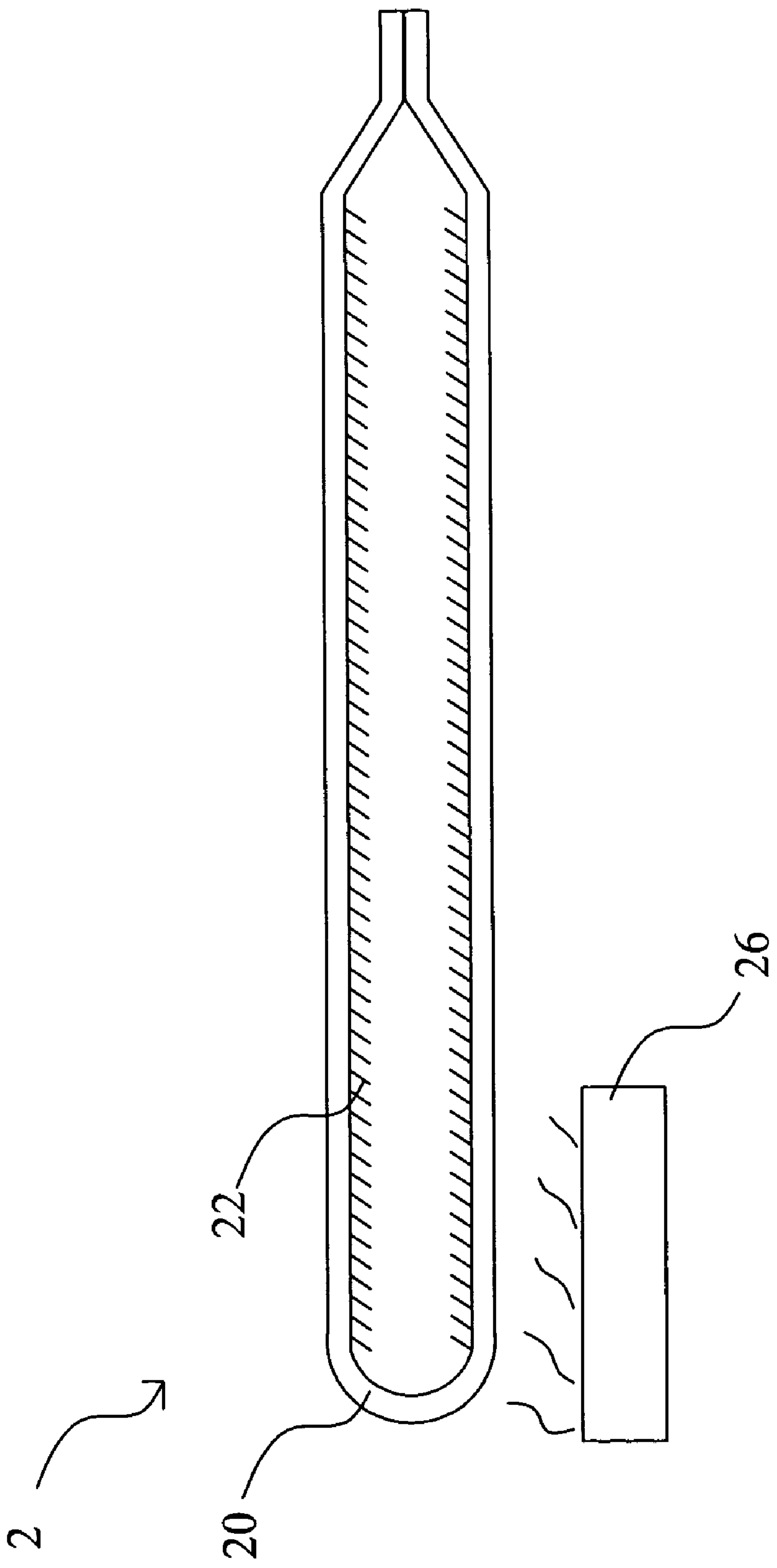
FIG. 2 (PRIOR ART)
FIG. 2 is a schematic drawing showing the working of a conventional pipe shape Vapor Chamber.
Figure 3:
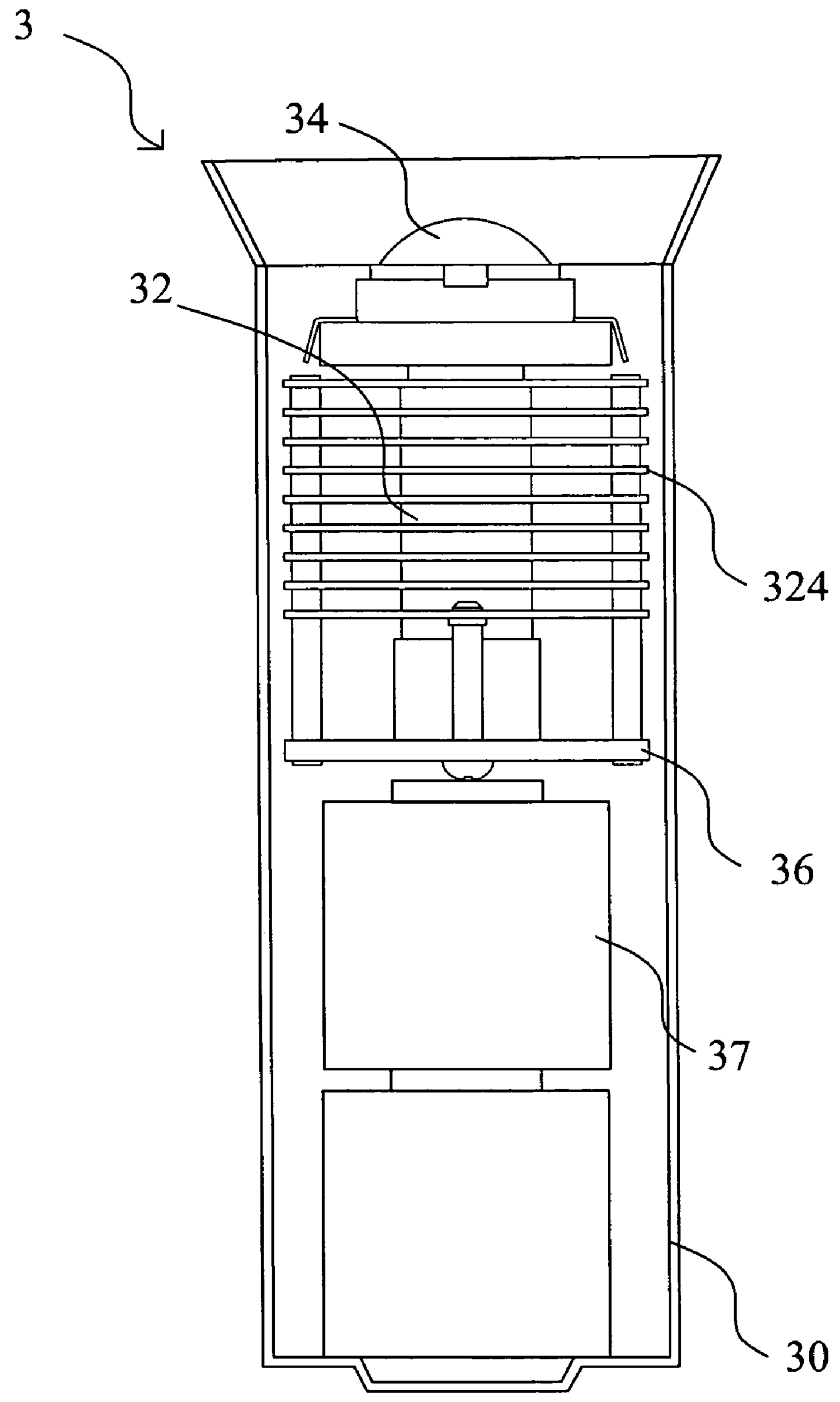
FIG. 3 is a longitudinal view in section of a light set constructed according to the present invention.

Referring to FIG. 3, a light set 3 is shown comprising a casing 30 that admits light, a thermoconductor 32 that can be a heat pipe or heat column mounted inside the casing 30 and has one end, namely, the top end thereof flatted, a plurality of radiation fins 324 arranged around the periphery of the thermoconductor 32 for dissipation of heat from the thermoconductor 32 to the outside space, a light source 34 mounted on the flat top end of the thermoconductor 32 for producing light through the casing 30, a circuit board 36 mounted inside the casing 30 and provided at the other end, namely, the bottom end of the thermoconductor 32, and power unit that can be a battery set or AC adapter 37 mounted inside the casing 30 and electrically connected to the circuit board 36 and the light source 34 to provide the necessary working voltage to the light source 34 through the circuit board 36.

Figure 4:
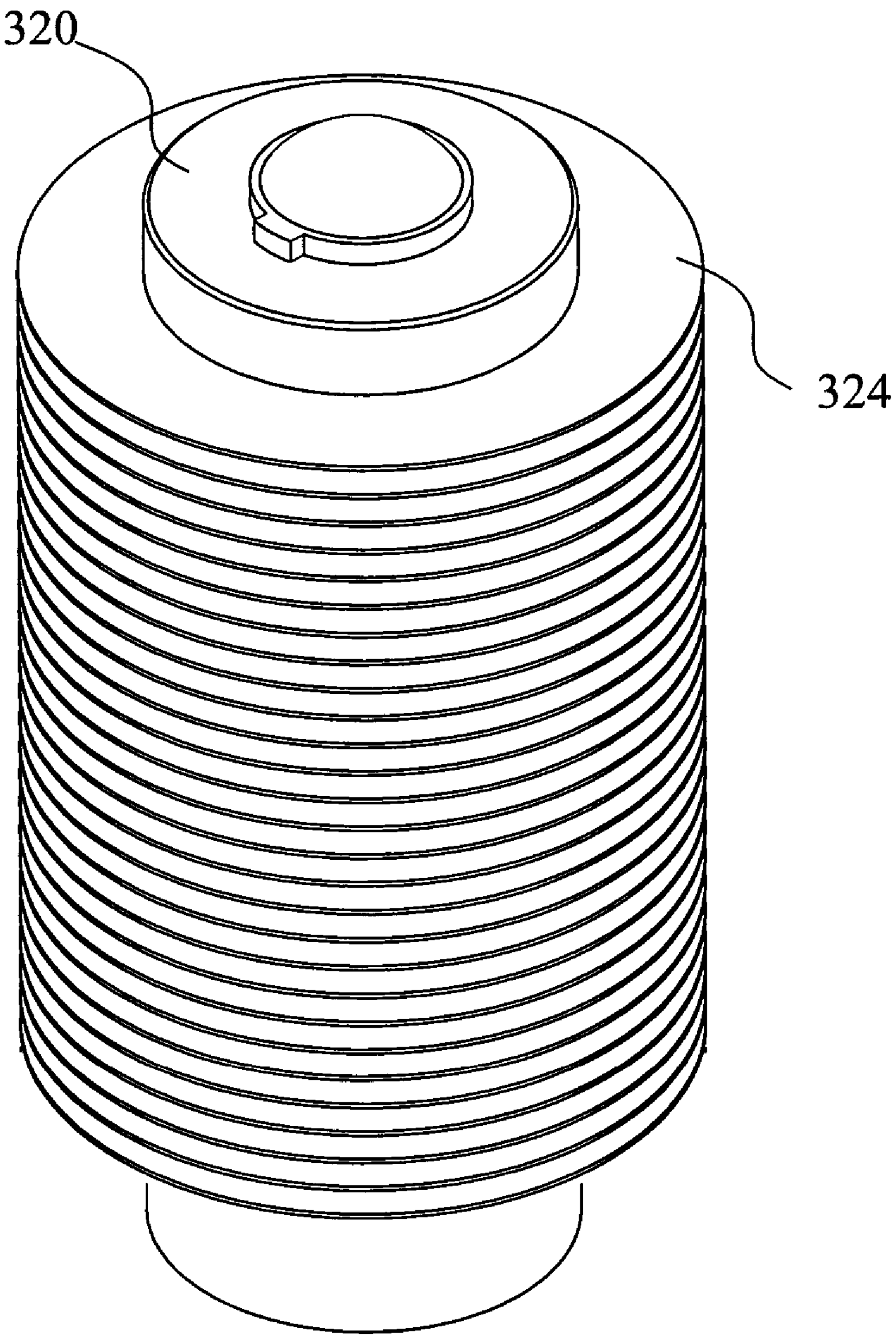
FIG. 4 is an elevational view of a part of the present invention, showing the radiation fins arranged around the periphery of the hollow body of the thermoconductor and the light source at the flat top end of the hollow body.
Figure 5:
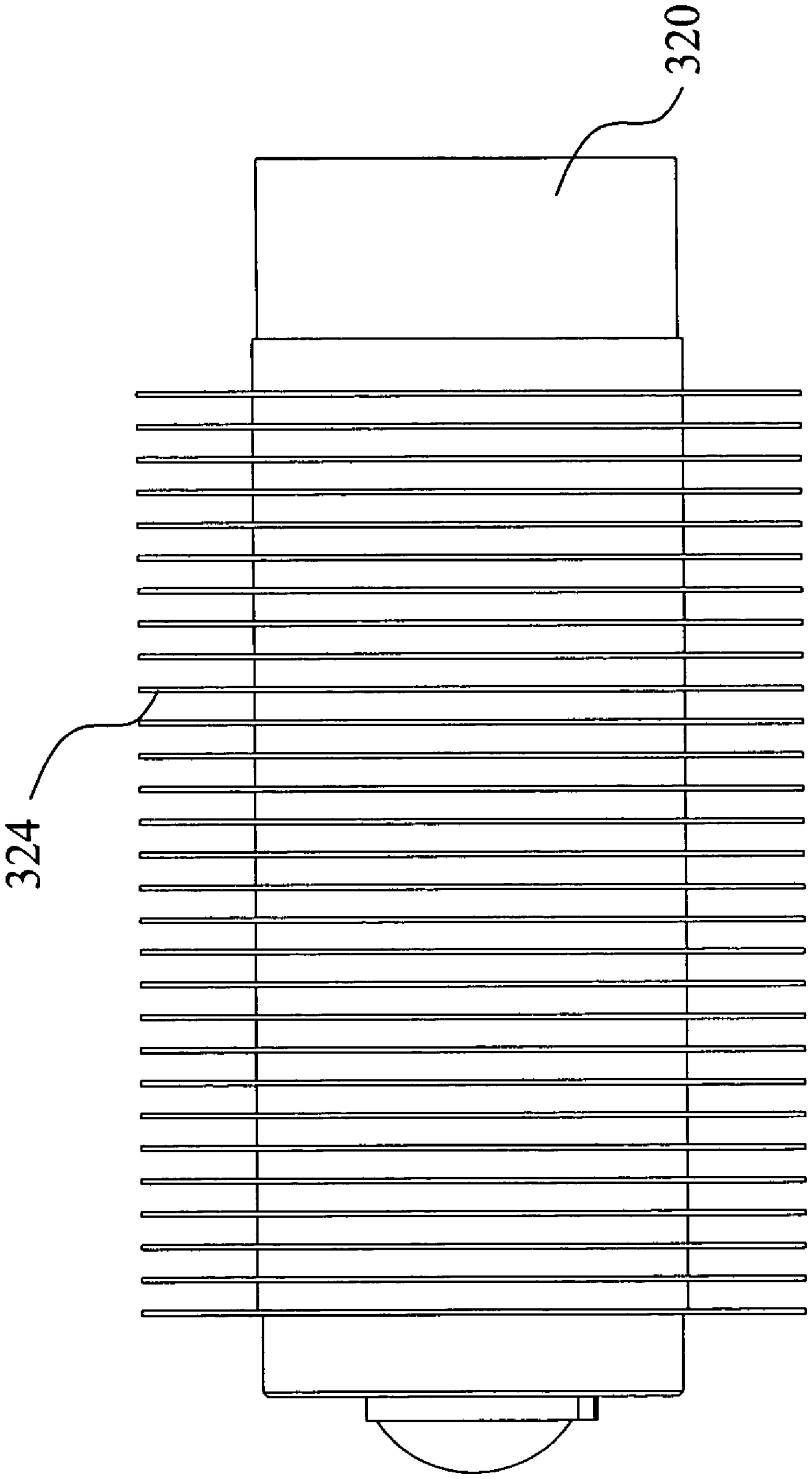
FIG. 5 is a side plain view of a part of the present invention, showing the radiation fins arranged around the periphery of the hollow body of the thermoconductor.

Referring to FIGS. 4 and 5, the thermoconductor 32 comprises a hollow body 320 formed of copper and kept in a vacuum status, a capillary structure (not shown) formed inside the hollow body 320, and a working fluid (not shown) filled in the hollow body 320. The hollow body 320 of the thermoconductor 32 has a cold side and a hot side. The working fluid is distributed in the capillary structure of the hollow body 320 of the thermoconductor 32. During operation of the light set 3, the working fluid in the hot side is evaporated into steam and travel toward the cold side of the hollow body 320 of thermoconductor 32 by thermal adsorbed from the light source 34, and the steam is then condensed into fluid status by the cold side of the hollow body 320 of thermoconductor 32 and guided back to the hot side of the hollow body 320 of thermoconductor 32 by the capillary structure. The aforesaid radiation fins 324 are provided at the cold side of the hollow body 320 of thermoconductor 32 for transferring heat energy from the cold side of the of the hollow body 320 of thermoconductor 32 to the outside space during changing of the work fluid between steam status and fluid status.

Figure 6:
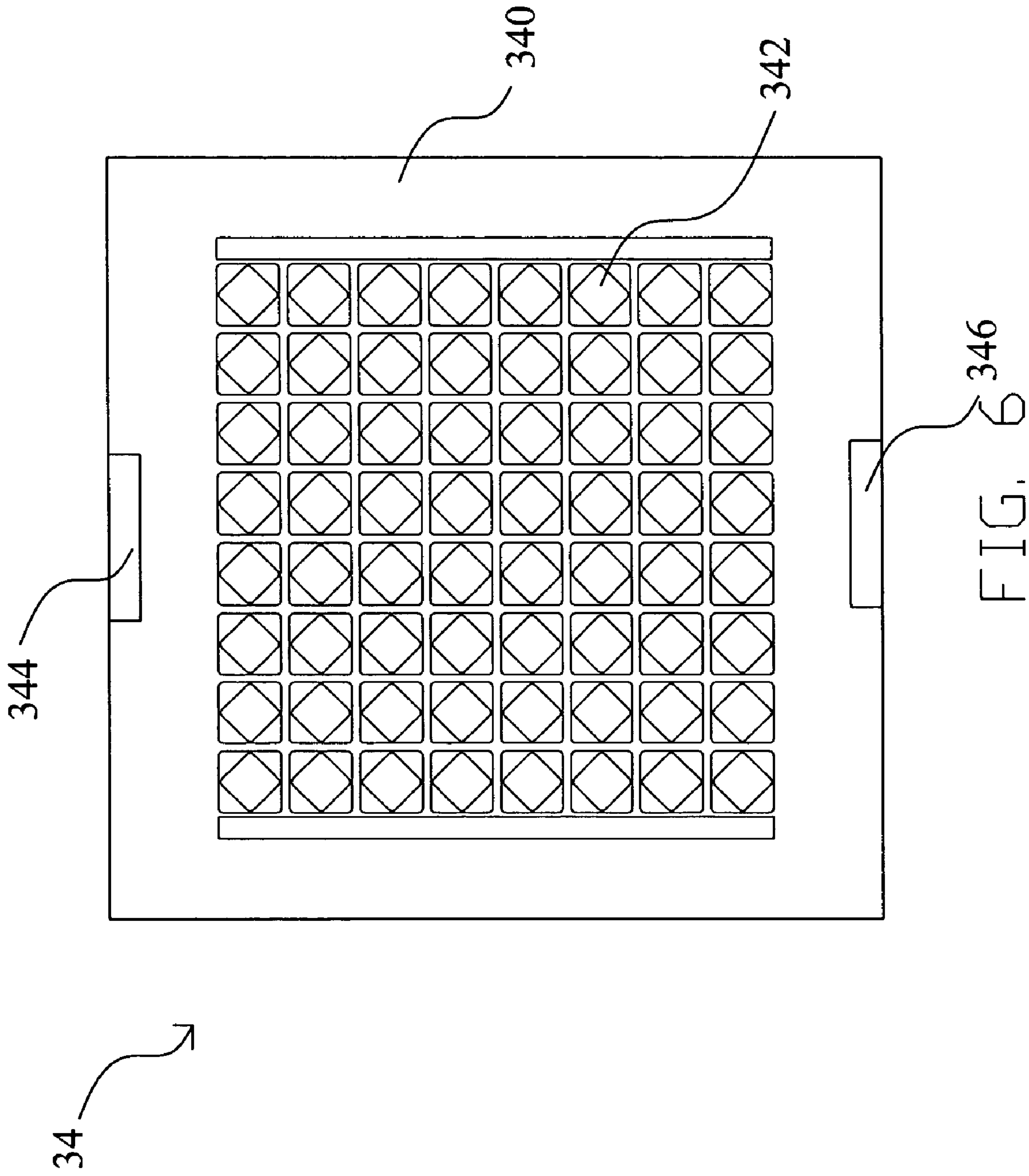
FIG. 6 is a top view of a part of the present invention, showing the structure of the light source.
Figure 7:
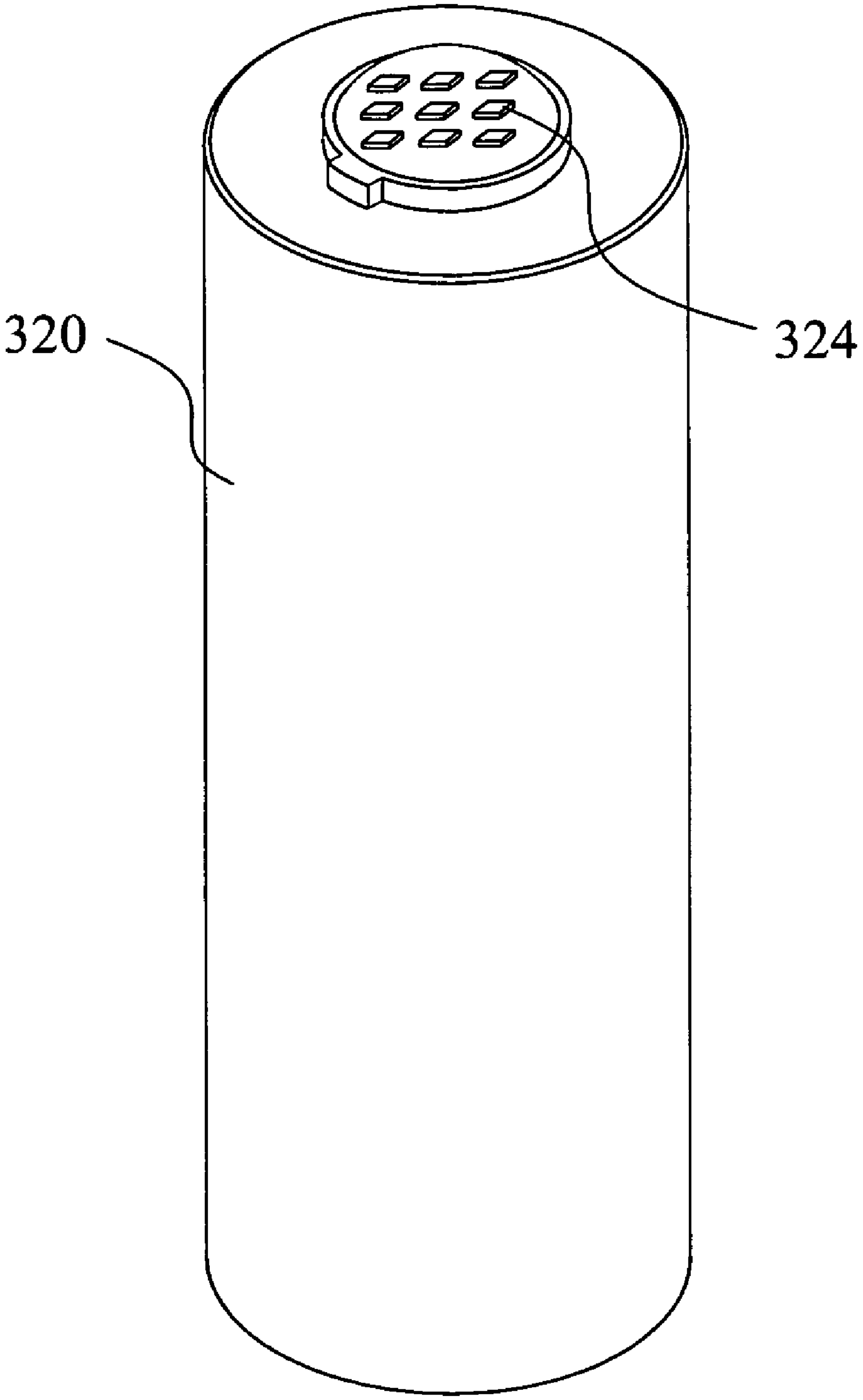
FIG. 7 is an elevational view of a part of the present invention, showing the light source provided at the flat top end of the hollow body of the thermoconductor.

Referring to FIG. 6, the light source 34 comprises a substrate 340, an array of light emitting devices, for example, LEDs (light emitting diodes) 342 arranged on the substrate 340, a positive electrode 344 and a negative electrode 346 mounted in the substrate 340 and respectively electrically connected to the positive and negative terminals of each of the LEDs 342. The substrate 340 is preferably a silicon base material. (light source 34 could also be an assembled LEDs package) Alternatively, the LEDs 342 of the light source 34 can be directly arranged on the flat top end of the hollow body 320 of thermoconductor 32 (see FIG. 7). The LEDs 342 can be installed in the substrate 340 (see FIG. 6) or the flat top end of the hollow body 320 of thermoconductor 32 (see FIG. 7) by wire bonding or flip chip.

Figure 8:
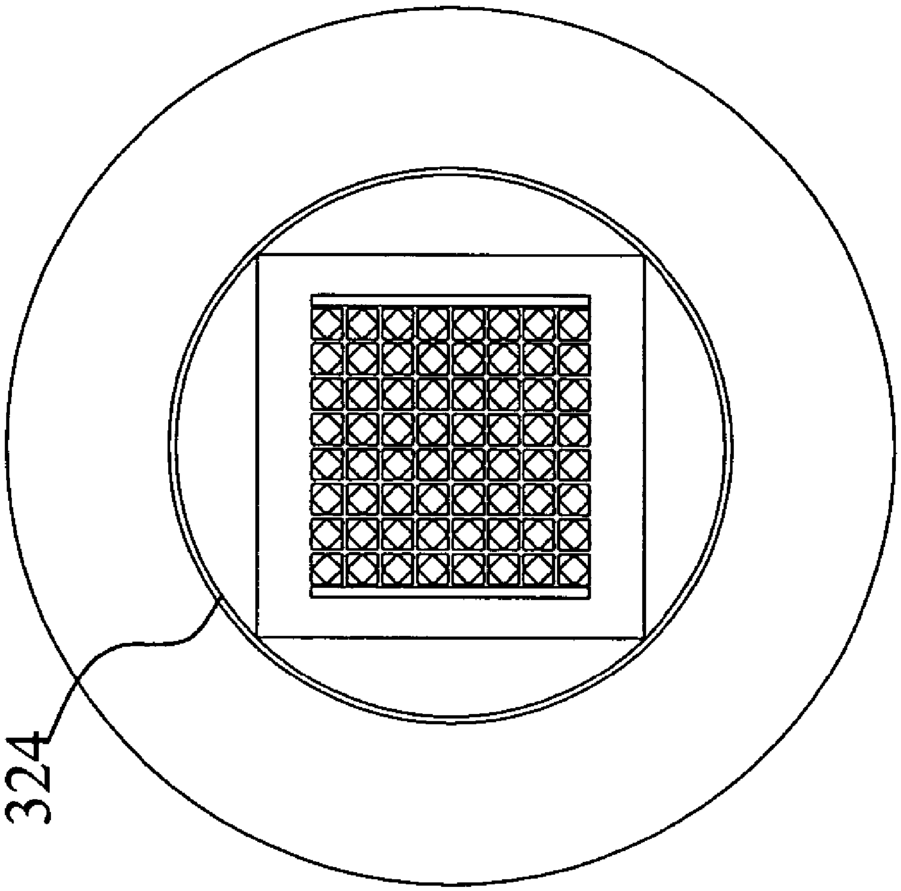
FIG. 8 is a top view of the present invention, showing one form of the radiation fins.
Figure 9:
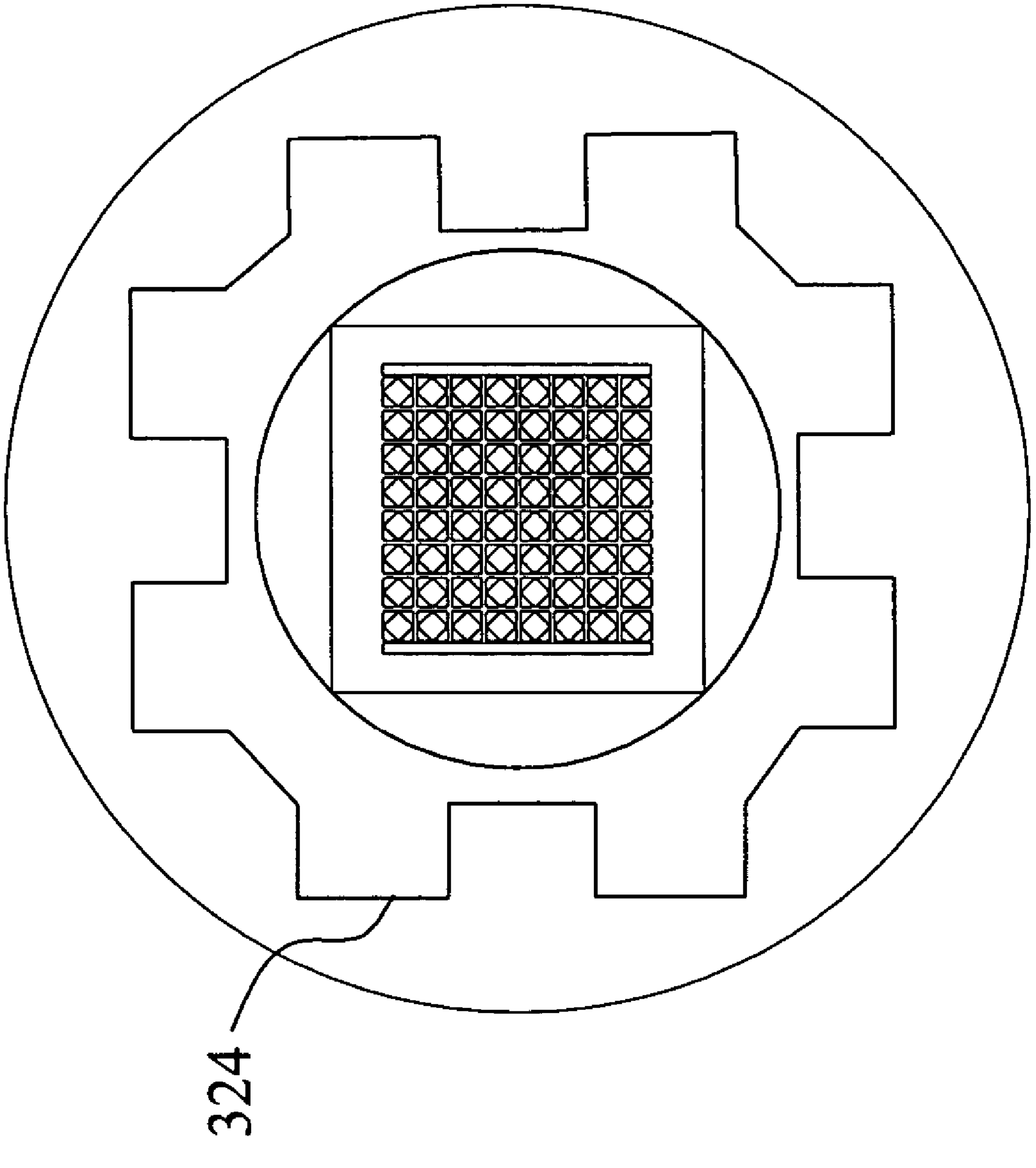
FIG. 9 is a top view of the present invention, showing an alternate form of the radiation fins.
Figure 10:
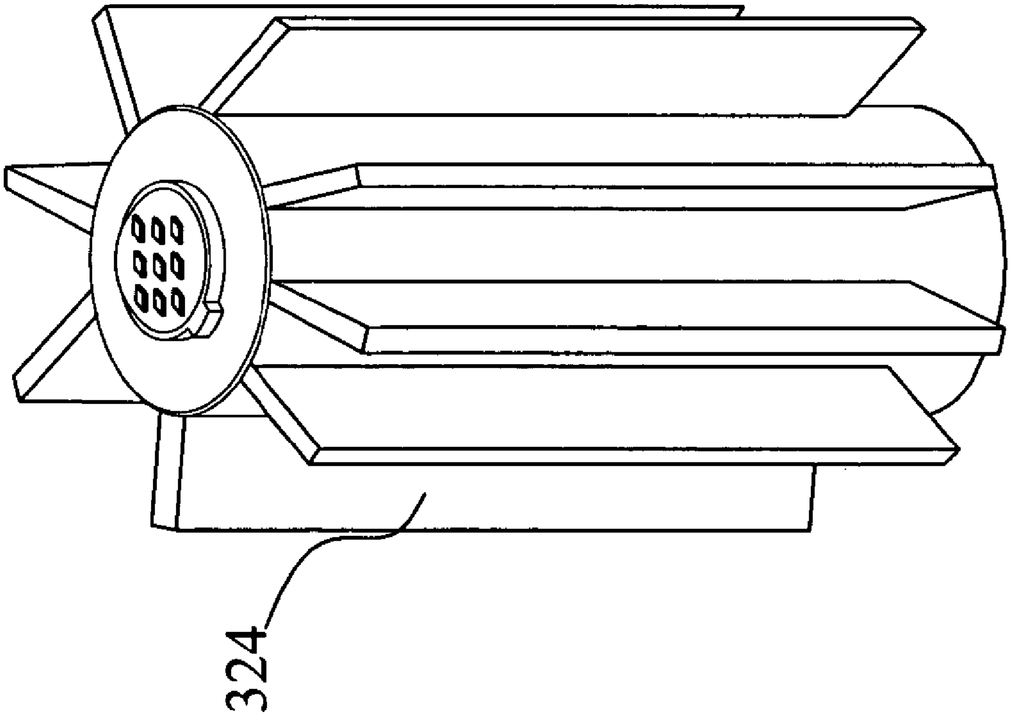
FIG. 10 is an elevational view showing another alternate form of the radiation fins according to the present invention.

The aforesaid radiation fins 324 may be variously embodied. According to the embodiment shown in FIG. 8, the radiation fins 324 have an annular shape and are arranged around the periphery of the hollow body 320 of thermoconductor 32. According to the embodiment shown in FIG. 9, the radiation fins 324 are shaped like a fourfold petal and arranged around the periphery of the hollow body 320 of the thermoconductor 32 inside the casing 30 (see also FIG. 3). According to the embodiment shown in FIG. 10, the radiation fins 324 are flat fins radially arranged around the periphery of the hollow body 320 of the thermoconductor 32 inside the casing 30 (see also FIG. 3). The radiation fins 324 can be made of copper or aluminum.

Figure 11:
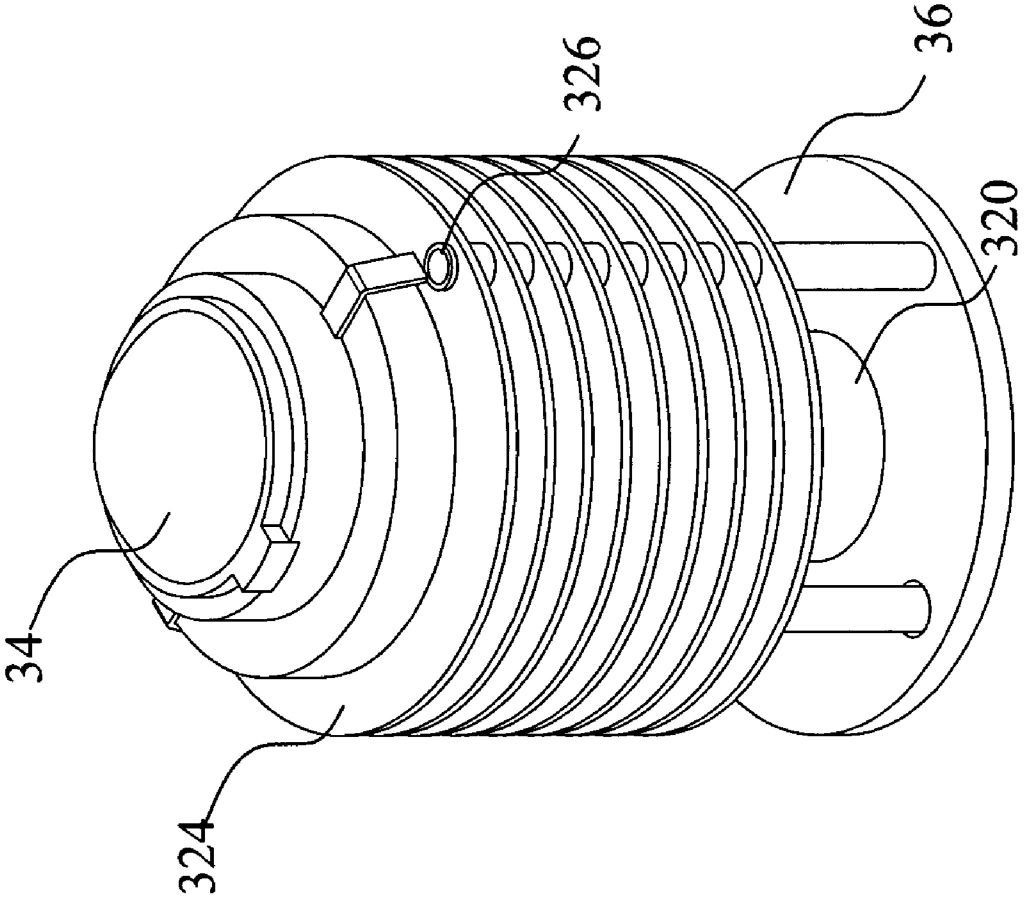
FIG. 11 is an elevational view of the present invention, showing the appearance of assembled lighting module.

Referring to FIG. 11, the radiation fins 324 each have two through holes 326 symmetrically disposed at two sides through which the positive and negative electrodes of the light source 34 connect to the circuit board 36.

Figure 12:
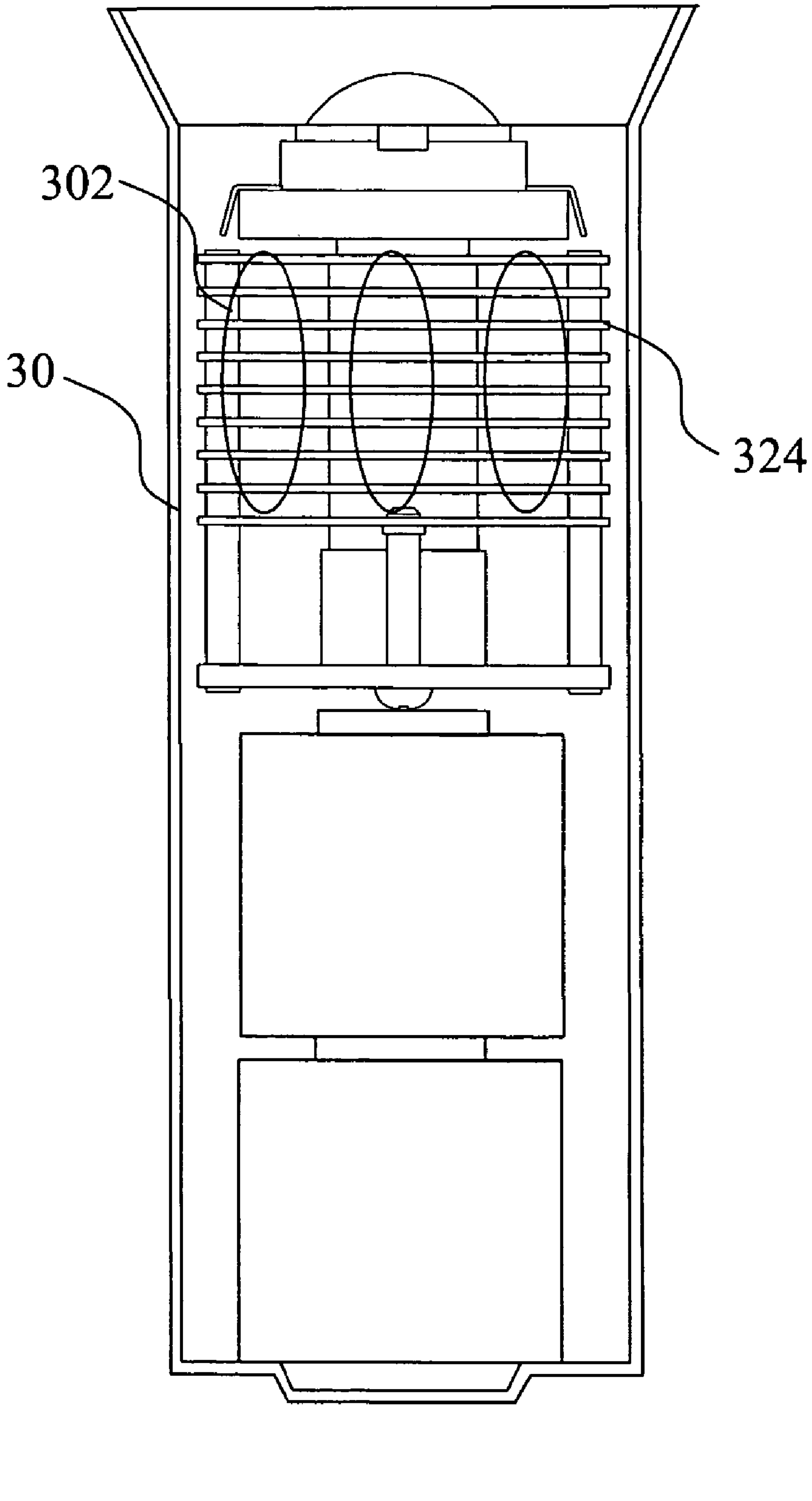
FIG. 12 is another longitudinal view in section of the present invention, showing air vents formed in the casing of the light set.

Referring to FIG. 12, the casing 30 has a plurality of air vents 302 corresponding to the radiation fins 324 for ventilation so that heat energy can quickly be transfered by air to the outside of the light set.

Figure 13:
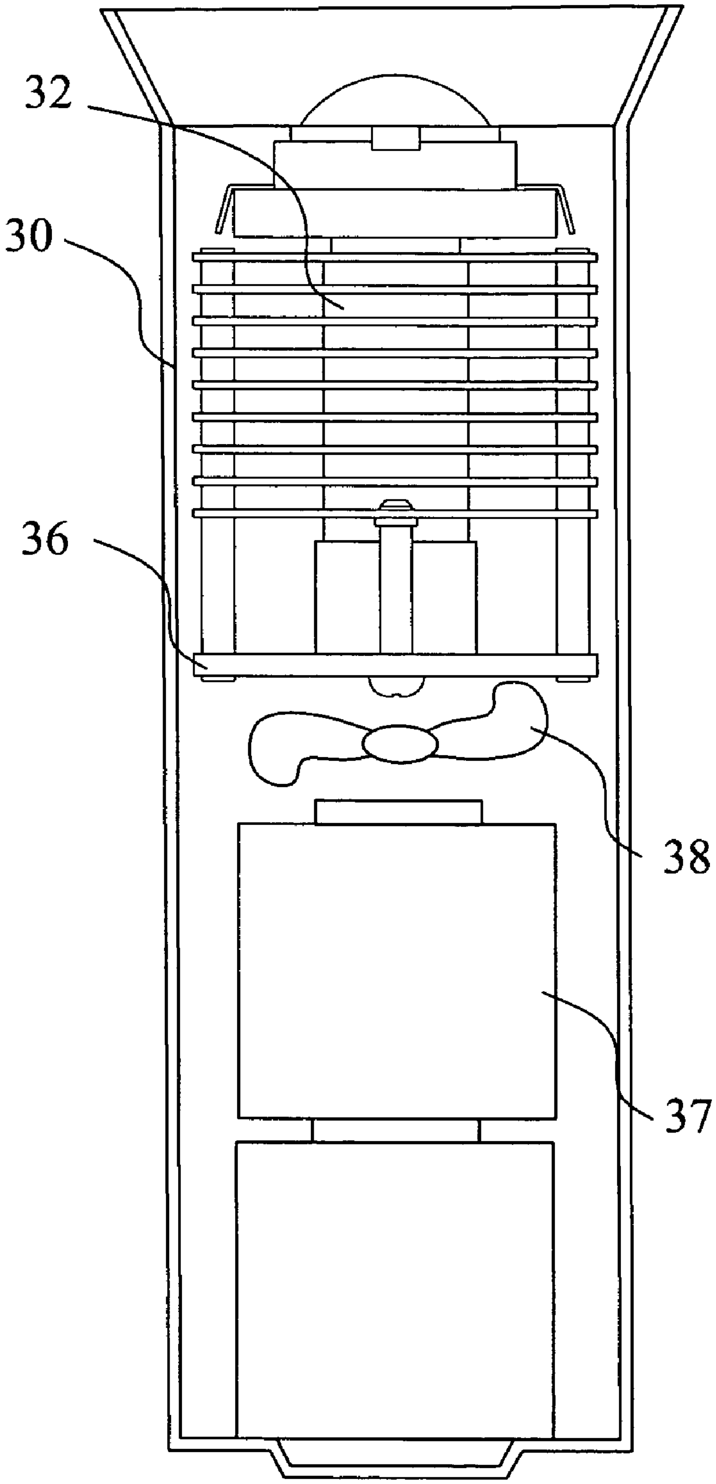
FIG. 13 is still another longitudinal view in section of the present invention, showing a fan provided inside the light and spaced between the circuit board and the power unit.

Referring to FIG. 13, a fan 38 is provided below the circuit board 36 for causing currents of air to carry heat energy out of the light set. The fan 38 and light source 34 obtains the necessary working voltage (or current) from the power unit 37. The circuit board 36 can design a temperature detection and fan control circuit (not shown) that detects the ambient temperature around the light source and controls ON/OFF status of the fan 38 subject to the detection result, i.e., the temperature detection and fan control circuit turns on the fan 38 when the ambient temperature surpassed a predetermined value, or turns off the fan 38 when the ambient temperature dropped below the predetermined value.

As indicated above, the present invention provides a light set with heat dissipation means, which has a thermoconductor with radiation fins and a fan mounted inside the casing thereof for quick dissipation of heat from the light source, thereby improving the working efficiency of the light source and prolonging its service life.

A prototype of light set with heat dissipation means has been constructed with the features of FIGS. 3~13. The light set with heat dissipation means functions smoothly to provide all of the features discussed earlier.

Although particular embodiments of the invention have been described in detail for purposes of illustration, various modifications and enhancements may be made without departing from the spirit and scope of the invention.

What the invention claimed is:

1. A light set comprising:

a casing that admits light;

a cylindrical fluid containing thermoconductor mounted inside said casing, said thermoconductor having a flat end portion;

a plurality of heat dissipation fins defining mutually spaced radially extending faces and respectively fastened to said cylindrical fluid containing thermoconductor to extend radially outward therefrom inside said casing, said heat dissipation fins each having at least one fin through hole formed in said radially extending face thereof;

at least a pair of support members arcuately displaced from one another with at least one support member having an axially extending through-passage for passing an electric conductor therethrough, said support members passing through said at least one fin through hole of said at least one heat dissipation fin, said support members being fixedly secured to each of said heat dissipation fins at a periphery thereof;

a light source installed on said flat end portion of said cylindrical fluid containing thermoconductor and electrically connected to said electric conductor; and a power unit mounted inside said casing and electrically connected to said light source through said electric conductor to provide said light source with the electric power.

2. The light set as claimed in claim 1, wherein said casing has at least one air vent for ventilation.

3. The light set as claimed in claim 1, wherein each said heat dissipation fin has an annular shape extended around the periphery of said cylindrical fluid containing thermoconductor.

4. The light set as claimed in claim 1, further comprising a circuit board mounted inside said casing at one end of said cylindrical fluid containing thermoconductor remote from said flat end portion and electrically connected in series between said power unit and said light source by said electric conductor for controlling the operation of said light source.

5. The light set as claimed in claim 4, further comprising a fan mechanism mounted inside said casing below said circuit board.

6. The light set as claimed in claim 5, wherein said fan mechanism is electrically connected to said circuit board and controlled by a temperature detection and fan control circuit of said circuit board that detects ambient temperature level and controls on/off of said fan mechanism subject to the detection result.

7. The light set as claimed in claim 1, wherein said light source is comprised of at least one light emitting diode.

8. The light set as claimed in claim 1, wherein said power unit is a battery set.

9. The light set as claimed in claim 1, wherein said power unit is an AC adapter.

10. The light set as claimed in claim 1, wherein said cylindrical fluid containing thermoconductor is a heat pipe.

11. The light set as claimed in claim 1, wherein said cylindrical fluid containing thermoconductor is a heat column.

12. A light set comprising:

a casing that admits light;

a cylindrical fluid containing thermoconductor mounted inside said casing, said cylindrical fluid containing thermoconductor having a flat end portion;

a plurality of metal radiation fins respectively fastened to a periphery of said cylindrical fluid containing thermoconductor to extend radially outward therefrom, a portion of the periphery being away from the flat end portion of said cylindrical fluid containing thermoconductor;

at least a pair of support members, arcuately displaced from one another at least one of said support members having an axially extending through passage, said support member being fixedly secured to engage fin through holes formed in radially extending faces of said radiation fins at a periphery thereof;

a light source installed on said flat end portion of said cylindrical fluid containig thermoconductor, and said light source including a substrate mounted on the flat end portion of said cylindrical fluid containing thermoconductor, at least one light emitting device mounted on said substrate, and a positive electrode and a negative electrode mounted on said substrate at two sides and respectively electrically connected between positive and negative terminals of each said light emitting device and positive and negative terminals of a circuit board; and a power unit mounted inside said casing and electrically connected to said light source to provide said light source with the necessary working power.

13. The light set as claimed in claim 12, wherein said substrate is made of silicon.

14. The light set as claimed in claim 12, wherein each said light emitting device is a light emitting diode or LEDs package.

15. A light set comprising:

a casing that admits light;

a cylindrical fluid containing thermoconductor with a flat end portion mounted inside said casing, wherein said cylindrical fluid containing thermoconductor is selected from the group consisting of a: heat pipe and heat column;

a plurality of planar heat dissipation fins respectively fastened to a periphery of said cylindrical fluid containing thermoconductor to extend radially outward therefrom at a position away from the flat end portion of said cylindrical fluid containing thermoconductor, each heat dissipation fin having at least one fin through hole formed in a radially extending face thereof offset from said periphery of said cylindrical fluid containing thermoconductor;

at least a pair of support members arcuately displaced from one another passing through said fin through holes of said heat dissipation fins, said support members defining an axially extending through-passage for passage of an electric conductor therethrough, said support members being fixedly secured to each of said heat dissipation fins at a periphery thereof;

a light source installed on said flat end portion of said cylindrical fluid containing thermoconductor and electrically connected to said electric conductor, and said light source includes a substrate mounted on the flat end portion of said cylindrical fluid containing thermoconductor, at least one light emitting device mounted on said substrate, and a positive electrode and a negative electrode mounted on said substrate at two sides and respectively electrically connected between positive and negative terminals of each said light emitting device and positive and negative terminals of a circuit board; and a power unit mounted inside said casing and electrically connected to said light source to provide said light source with the necessary working power.

16. The light set as claimed in claim 15, wherein said casing has at least one air vent for ventilation.

17. The light set as claimed in claim 15, wherein each said heat dissipation fin has an annular shape extended around the periphery of said cylindrical fluid containing thermoconductor.

18. The light set as claimed in claim 15, wherein said circuit board is mounted inside said casing at one end of said cylindrical fluid containing thermoconductor remote from said flat end portion and electrically connected in series between said power unit and said light source by said electric conductor means for controlling the operation of said light source.

19. The light set as claimed in claim 18, further comprising a fan mechanism mounted inside said casing below said circuit board, wherein said fan mechanism is electrically connected to said circuit board and controlled by a temperature detection and fan control circuit of said circuit board that detects ambient temperature level and controls on/off of said fan mechanism subject to the detection result.

20. A light set comprising:

a casing that admits light;

a cylindrical fluid containing thermoconductor mounted inside said casing, said thermoconductor having a flat end portion;

a plurality of heat dissipation fins respectively fastened to a periphery of said cylindrical fluid containing thermoconductor to extend radially outward therefrom, the plurality of heat dissipation fins being fastened to a position of the periphery away from the flat end portion of said cylindrical fluid containing thermoconductor, each heat dissipation fin having at least one through hole formed in a radially extending face thereof offset from said periphery of said cylindrical fluid containing thermoconductor for passage of electric conductor means therethrough;

a plurality of LED chips mounted on a semiconductor substrate, the semiconductor substrate having electrical circuits therein and being directly installed on said flat end portion of said cylindrical fluid containing thermoconductor, the plurality of LED chips electrically coupling to said electric conductor means through the semiconductor substrate; and a power unit mounted inside said casing and electrically coupled to said electric conductor means to provide said plurality of LED chips with electrical power.

21. The light set as claimed in claim 20, wherein said cylindrical fluid containing thermoconductor is a heat pipe or heat column.

22. The light set as claimed in claim 20, wherein the semiconductor substrate is a Si substrate.

23. A light set comprising:

a casing that admits light;

a fluid containing heat pipe mounted inside said casing, the heat pipe having a flat end portion thereon;

a plurality of heat dissipation fins respectively fastened to a periphery of said heat pipe to extend radially outward therefrom, the plurality of heat dissipation fins being fastened to a position of the periphery away from the flat end portion of said heat pipe, each heat dissipation fin having at least one through hole formed in a radially extending face thereof offset from said periphery of said heat pipe for passage of electric conductor means therethrough;

a plurality of LED chips mounted on a semiconductor substrate, the semiconductor substrate having electrical circuits therein and being directly installed on said flat end portion of said heat pipe, the plurality of LED chips electrically coupling to said electric conductor means though the semiconductor substrate; and a power unit mounted inside said casing and electrically coupled to said electric conductor means to provide said plurality of LED chips with electrical power.

24. The light set as claimed in claim 23, wherein the semiconductor substrate is a Si substrate.

* * * * *

UNITED STATES PATENT AND TRADEMARK OFFICE
CERTIFICATE OF CORRECTION

PATENT NO. : 7,438,448 B2
APPLICATION NO. : 11/019161
DATED : October 21, 2008
INVENTOR(S) : Jeffrey Chen It is certified that error appears in the above-identified patent and that said Letters Patent is hereby corrected as shown below:

Title Page item (30) should read as follows:

Delete the date “Nov. 10, 2004” and insert the corrected Foreign Application Priority date --Oct. 11, 2004--.

Signed and Sealed this

Twenty-eighth Day of July, 2009

John Doll

JOHN DOLL
*Acting Director of the United States Patent and Trademark Office*